United States Patent
Shibayama et al.

(10) Patent No.: US 8,081,017 B2
(45) Date of Patent: Dec. 20, 2011

(54) CLOCK SIGNAL FREQUENCY DIVIDING CIRCUIT AND CLOCK SIGNAL FREQUENCY DIVIDING METHOD

(75) Inventors: Atsufumi Shibayama, Tokyo (JP); Koichi Nose, Tokyo (JP)

(73) Assignee: NEC Corporation, Tokyo (JP)

( * ) Notice: Subject to any disclaimer, the term of this patent is extended or adjusted under 35 U.S.C. 154(b) by 110 days.

(21) Appl. No.: 12/515,901

(22) PCT Filed: Nov. 9, 2007

(86) PCT No.: PCT/JP2007/071790
§ 371 (c)(1),
(2), (4) Date: May 21, 2009

(87) PCT Pub. No.: WO2008/065869
PCT Pub. Date: Jun. 5, 2008

(65) Prior Publication Data
US 2010/0052740 A1     Mar. 4, 2010

(30) Foreign Application Priority Data
Nov. 29, 2006    (JP) .................................. 2006-322410

(51) Int. Cl.
*H03K 21/00*    (2006.01)
(52) U.S. Cl. ............................. 327/115; 327/117; 377/47
(58) Field of Classification Search .......... 327/113–115, 327/117, 118; 377/47, 48
See application file for complete search history.

(56) References Cited

U.S. PATENT DOCUMENTS

| | | | | |
|---|---|---|---|---|
| 4,348,640 A * | 9/1982 | Clendening | ...................... | 377/48 |
| 4,866,741 A * | 9/1989 | Minuhin | .......................... | 377/48 |
| 5,040,197 A * | 8/1991 | Theobald | ......................... | 377/48 |
| 5,088,057 A * | 2/1992 | Amrany et al. | ................ | 708/103 |
| 5,907,590 A * | 5/1999 | Mogi | ................................ | 377/48 |
| 6,690,631 B2 * | 2/2004 | De Cuyper | ................... | 369/47.3 |
| 6,879,654 B2 * | 4/2005 | Austin | ............................. | 377/48 |
| 7,205,800 B2 * | 4/2007 | Hasegawa | ..................... | 327/115 |
| 7,587,019 B2 * | 9/2009 | Yu et al. | ........................... | 377/47 |

FOREIGN PATENT DOCUMENTS

| | | |
|---|---|---|
| JP | 1997223959 A | 8/1997 |
| JP | 2002057578 A | 2/2002 |
| JP | 2005045507 A | 2/2005 |
| JP | 2006148807 A | 6/2006 |

OTHER PUBLICATIONS

International Search Report for PCT/JP2007/071790 mailed Jan. 15, 2008.

* cited by examiner

*Primary Examiner* — Patrick O'Neill

(57) ABSTRACT

To provide a rational frequency dividing circuit wherein the variations in cycle times of frequency divided clock signals are small, there are many occasions in which the minimum cycle time of frequency divided clock signals and test costs are small. A clock signal frequency dividing circuit, the frequency division ratio of which is specified as N/M where are both N and M are integers, includes an output clock selecting circuit (200) that selects one of three situations: an input clock signal is outputted as it is, the input clock signal is inverted and outputted and the input clock signal is not outputted; and a clock selection control circuit (100) that generates a control signal for controlling the foregoing selection of the output clock selecting circuit. The clock selection control circuit controls the foregoing selection of the output clock selecting circuit at every cycle of the input clock signal.

5 Claims, 10 Drawing Sheets

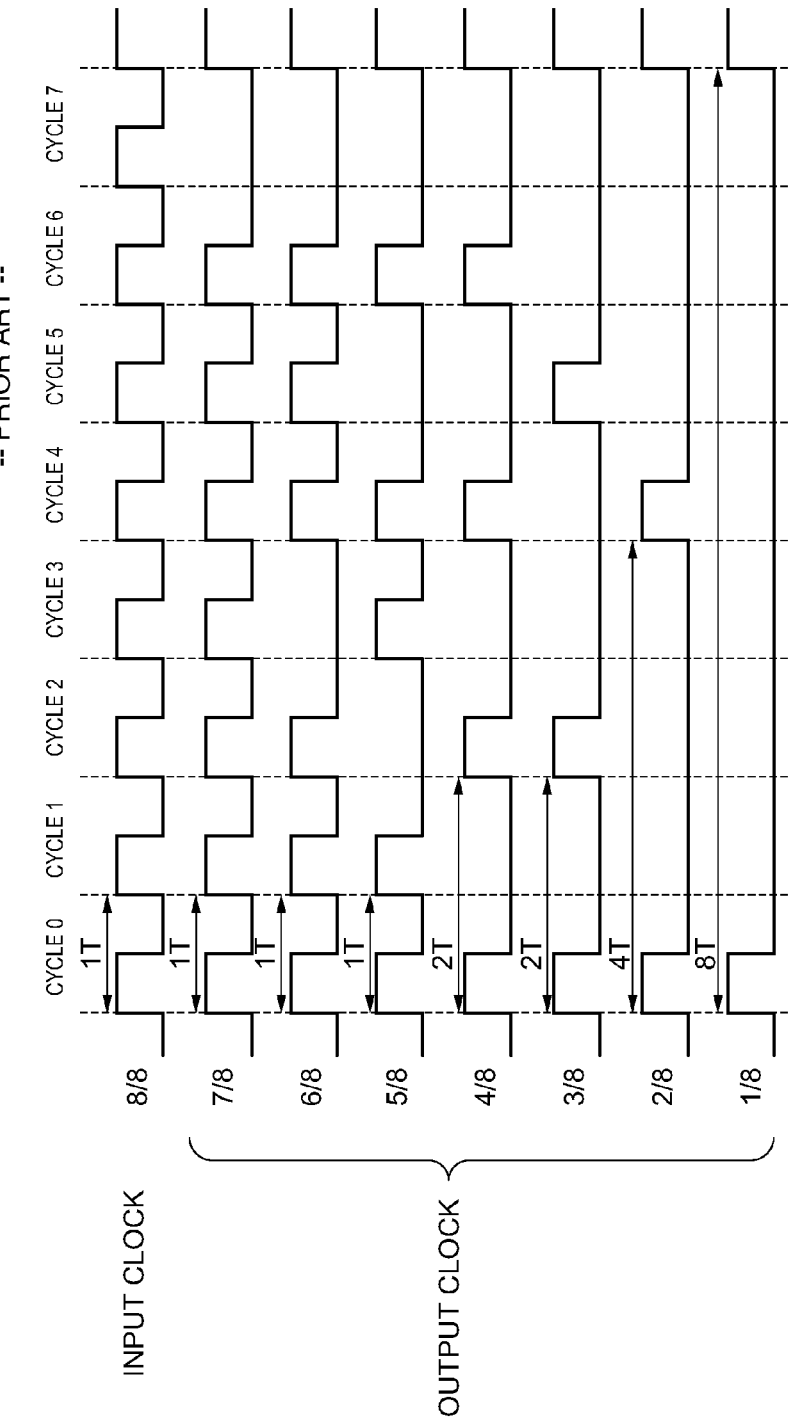
FIG. 10 -- PRIOR ART --

CLOCK SIGNAL FREQUENCY DIVIDING CIRCUIT AND CLOCK SIGNAL FREQUENCY DIVIDING METHOD

This application is the National Phase of PCT/JP2007/071790, filed Nov. 9, 2007, which is based upon and claims priority from Japanese Patent Application No. 2006-322410 filed Nov. 29, 2006, which is incorporated herein in its entirety.

TECHNICAL FIELD

The present invention relates to a clock signal frequency dividing circuit and a clock signal frequency dividing method which can achieve arbitrary rational frequency division of a clock with low electric power, a small area and a low design cost.

BACKGROUND ART

As a clock frequency dividing circuit which divides a frequency of a clock signal having an arbitrary frequency to generate a clock signal having a lower frequency, a frequency dividing circuit (an integral frequency dividing circuit) in which a frequency dividing ratio, that is, a ratio of a frequency of a clock signal before divided to a frequency of a clock signal after divided is 1/M (M is an integer) can be easily achieved by using a counter circuit.

On the other hand, a frequency dividing circuit (a rational frequency dividing circuit) being capable of dividing even if a frequency dividing ratio is N/M (N and M are integers) is proposed (Patent Document 1 and Patent Document 2, for example).

According to these related arts, a value set to numerator of a frequency dividing ratio (the value N in the frequency dividing ratio N/M) is cumulatively added at every cycle of an input clock signal, and when the addition result becomes larger than a value set to denominator of a frequency dividing ratio (the value M in the frequency dividing ratio N/M), rational frequency division is achieved by performing an operation to subtract M from the addition result and then by picking the pulse of the input clock signal appropriately with reference to the addition result.

In addition, as another related art, a clock generating circuit using a phase interpolator is proposed (Patent Document 3, for example). According to Patent Document 3, the phase interpolator makes it possible to generate edge at a timing other than a timing of the edge of an input clock signal. Therefore, it is possible to generate a rational frequency-divided clock signal having a constant cycle time.

Patent Document 1: Japanese Patent Application Laid-open No. 2005-045507
Patent Document 2: Japanese Patent Application Laid-open No. 2006-148807
Patent Document 3: Japanese Patent Application Laid-open No. 2002-057578

DISCLOSURE OF THE INVENTION

Problems to be Solved by the Invention

The clock frequency dividing circuit disclosed in Patent Document 1 or Patent Document 2 achieves frequency division by picking the pulse of an input clock signal selectively. Therefore, the timing of outputting the pulse of a frequency-divided clock signal is limited with the timing of the pulse of the input clock signal.

Accordingly, there is a problem that the cycle time of the frequency-divided clock signal fluctuates greatly at every cycle. Further, since the minimum value of the cycle time does not increase in proportion to a frequency dividing ratio, the maximum delay constraint of a circuit driven by the frequency-divided clock signal cannot be relaxed in response to a frequency. More specifically, since the cycle time does not increase in the case where the frequency dividing ratio is 1 to 1/2, it cannot be applied for generating a clock for a DVFS (Dynamic Voltage Frequency Scaling) which controls voltage in response to the cycle time in order to reduce electric power.

A specific example of the problem in rational frequency dividing by the related arts described above will be explained with reference to FIG. 10. FIG. 10 shows an example of clock frequency division by the aforementioned related arts and shows an output clock signal which is generated by dividing an input clock signal (8/8) by the frequency dividing ratio of 7/8 to 1/8.

As shown in FIG. 10, there is a problem that, in the frequency dividing ratio of 7/8 to 5/8 corresponding to the frequency dividing ratio of 1 to 1/2, the minimum cycle time of the frequency-divided clock signal remains 1 cycle of the input clock signal and does not increase in response to the frequency dividing ratio. Further, for example, in the case where the frequency dividing ratio is 5/8, the maximum value of the cycle time of the frequency-divided clock signal is 2 cycle of the input clock signal. Therefore, there is a problem that the cycle time of the frequency-divided clock signal fluctuates between 1 cycle and 2 cycle of the input clock signal at every cycle.

The clock frequency dividing circuit disclosed in Patent Document 3 is capable of generating a rational frequency-divided clock signal having a constant cycle time by using a phase interpolator. However, the phase interpolator needs a large capacity in the case of dividing an input clock signal having a relatively low frequency, e.g. an input clock signal having a frequency equal to or less than 500 MHz. Therefore, there are problems that it needs a large amount of electric power consumption and a large layout area and also it has susceptibility to noise. Further, since it is an analog circuit, a dedicated design is required, and a design and validation cost becomes increased.

It is therefore an object of the present invention to solve the aforementioned problems and to provide a clock signal frequency dividing circuit and a clock signal frequency dividing method with which the fluctuations in the cycle time of a frequency-divided clock signal becomes small, the minimum cycle time of the frequency-divided clock signal is extended in accordance with a frequency dividing ratio in many occasions, electric power consumption is low, a layout area are small, and a design and validation cost is low.

Means for Solving the Problems

In order to achieve such an object, a clock signal frequency dividing circuit according to the present invention, in which a frequency dividing ratio is defined as N/M being a ratio of two integers N and M, includes: a clock selecting circuit for selecting any one of three situations: an input clock signal is output as it is, the input clock signal is inverted and output, and the input clock signal is not output; and a control unit for generating a control signal to control the selection of the clock selecting circuit, wherein the control unit controls the selection of the clock selecting circuit at every cycle of the input clock signal.

A clock signal frequency dividing method according to the present invention, which outputs a clock signal in which a frequency dividing ratio is defined as N/M being a ratio of two integers N and M, includes: a selecting step of selecting any one of three situations; an input clock signal is output as it is, the input clock signal is inverted and output, and the input clock signal is not output; and a controlling step of generating a control signal to control the selection in the selecting step, wherein the selection of the clock selecting circuit is controlled at every cycle of the input clock signal in the controlling step.

Effects of the Invention

According to the present invention, the frequency-divided clock signal is generated by selecting one of three situations: an input clock signal is output as it is; an input clock signal is inverted and output; or an input clock signal is not output, in such a manner as selecting one situation in which the phase of the signal to be output approximates the phase of an ideal frequency-divided clock signal having a constant cycle time. Therefore, the minimum cycle time of the frequency-divided clock signal is extended in accordance with a frequency dividing ratio in many occasions, and it is possible to generate a rational frequency-divided clock signal having small fluctuations in the cycle time.

Further, according to the present invention, it is enough to be configured by only a digital logic circuit and to provide a function of selecting one of three situations: an input clock signal is output as it is, the input clock signal is inverted and output, and the input clock signal is not output, so a rational frequency dividing circuit in which its electric power consumption is low, a layout area is small, and a design and validation cost is low can be achieved.

DESCRIPTION OF EXEMPLARY EMBODIMENTS

Next, exemplary embodiments of the invention will be explained with reference to the drawings.

Exemplary Embodiment 1

As shown in FIG. 1, a clock signal frequency dividing circuit according to the exemplary embodiment 1 includes a clock selection control circuit 100 and an output clock selecting circuit 200, divides an input clock signal by a frequency dividing ratio N/M (M and N are integers) and outputs it as an output clock signal.

The clock selection control circuit 100 operates at the timing of the input clock signal and generates a clock phase control signal 101 and a clock output control signal 102 at every cycle of the input clock signal with reference to M−N, −N and N which are the setting signals of the frequency dividing ratio. The clock selection control circuit 100 includes a phase calculation circuit 105, a clock output judging circuit 106 and a clock phase judging circuit 107.

The phase calculation circuit 105 calculates the phase of an ideal frequency-divided clock signal in which the frequency dividing ratio is N/M and a cycle time is constant, with respect to the input clock signal, at every cycle of the input clock signal.

The clock output judging circuit 106 judges whether to output the input clock signal to the output clock signal with reference to the phase calculation result calculated by the phase calculation circuit 105 and outputs it as the clock output control signal 102.

More specifically, in the case where the phase calculation result indicates less than 1 cycle of the input clock signal, the clock output judging circuit 106 outputs a control value as the clock output control signal 102 to control the output clock selecting circuit 200 to output the input clock signal as the output clock signal. In the case where the phase calculation result indicates more than 1 cycle of the input clock signal, the clock output judging circuit 106 outputs the control value as the clock output control signal 102 to control the output clock selecting circuit 200 not to output the input clock signal as the output clock signal.

The clock phase judging circuit 107 refers to the phase of the ideal frequency-divided clock signal with respect to the input clock signal, calculated by the phase calculation circuit 105, and judges the phase being closer to the phase of the ideal frequency-divided clock signal, out of the phase of the output clock signal in the case of outputting the input clock signal as it is and the phase of the output clock signal in the case of inverting and outputting the input clock signal. Then, the clock phase judging circuit 107 outputs the control value as the clock phase control signal 101 with which the output clock selecting circuit 200 selects the output clock signal whose phase is closer to the phase of an ideal frequency-divided clock signal.

More specifically, in the case where the phase calculation result indicates less than 0.5 cycle of the input clock signal, the clock phase judging circuit 107 outputs the control value to control the output clock selecting circuit 200 so as to output the input clock signal as it is to the output clock signal to the clock phase control signal 101. In the case where the phase calculation result indicates more than 0.5 cycle of the input clock signal, the clock phase judging circuit 107 outputs the control value to control the output clock selecting circuit 200 so as to invert and output the input clock signal to the output clock signal to the clock phase control signal 101.

The output clock selecting circuit 200 selects one of three situations: the input clock signal is output as it is, the input clock signal is inverted and output, and the input clock signal is not output, based on an output clock control signal given by the clock phase control signal 101 and the clock output control signal 102.

The clock selecting circuit 200 includes an AND circuit 210, an inverter circuit 211 and a selector circuit 212.

The AND circuit 210 masks the input clock signal based on the clock output control signal 102. More specifically, in the case where the value of the clock output control signal 102 is 0, the AND circuit 210 masks the input clock signal. In the case where the value of the clock output control signal 102 is 1, the AND circuit 210 does not mask the input clock signal.

The inverter circuit 211 inverts the input clock signal. The selector circuit 212 selects either outputting the input clock signal as it is as the output clock signal or outputting a signal obtained by inverting the input clock signal as the output clock signal based on the clock phase control signal 101.

In the case where the value of the clock phase control signal 101 is 0, the selector circuit 212 outputs the input clock signal as it is as the output clock signal. In the case where the value of the clock phase control signal 101 is 1, the selector circuit 212 outputs a signal obtained by inverting the input clock signal as the output clock signal.

As described above, when the value of the clock phase control signal 101 is 0 and the value of the clock output control signal 102 is 1, the output clock selecting circuit 200 outputs the input clock signal as the output clock signal based on the clock phase control signal 101 and the clock output control signal 102. When the value of the clock phase control signal 101 is 1 and the value of the clock output control signal 102 is 1, the output clock selecting circuit 200 inverts the input clock signal and outputs it as the output clock signal. When the value of the clock output control signal 102 is 0, the output clock selecting circuit 200 does not output a clock signal as the output clock signal by masking the input clock signal.

The clock selection control circuit 100 inputs M−N, −N and N which are the setting signals of the frequency dividing ratio, and generates the clock phase control signal 101 and the clock output control signal 102 which are control signals of the output clock selecting circuit 200 in each cycle of the input clock signal.

The details of the clock selection control circuit 100 will be explained with reference to FIG. 2. The phase calculation circuit 105 of the clock selection control circuit 100 includes a selector circuit 114, an adder 110 and flip-flop circuits 120 and 121. The clock output judging circuit 106 of the clock selection control circuit 100 includes a comparator 112. The clock phase judging circuit 107 of the clock selection control circuit 100 includes a double multiplier 115 and a comparator 113.

The flip-flop circuits 120 and 121 of the phase calculation circuit 105 operate based on the timing of rising edge of the input clock signal (the input clock signal is not shown in FIG. 2).

Next, the operation of the clock selection control circuit 100 will be explained with reference to FIG. 3. FIG. 3 is a timing diagram showing the operation of the clock selection control circuit 100 when the frequency dividing ratio is N/M=5/8. FIG. 3 shows the input clock signal, the output clock signal, a phase calculation value 103 output by the adder 110, the clock phase control signal 101 output by the comparator 113 and the clock output control signal 102 output by the comparator 112. Further, for comparison, the ideal frequency-divided clock signal in which the frequency dividing ratio is 5/8 and the cycle time is constant, and the phase with respect to the input clock signal are shown.

In FIG. 3, in cycle 0, the value of the phase calculation value 103 is assumed to be 0. The double multiplier 115 doubles the value of the phase calculation value 103 and outputs it to the comparator 113.

The comparator 113 refers to the comparison result of a double value of the phase calculation value 103 and N. In the case where the double value of the phase calculation value 103 is equal to or more than N, the value 1 is output to the clock phase control signal 101. In the case where the double value of the phase calculation value 103 is less than N, the value 0 is output to the clock phase control signal 101.

In cycle 0, the value of the clock phase control signal 101 is 0. The comparator 112 refers to the comparison result of the phase calculation value 103 and N. In the case where the phase calculation value 103 is equal to or more than N, the value 0 is output to the clock output control signal 102. In the case where the phase calculation value 103 is less than N, the value 1 is output to the clock output control signal 102. In cycle 0, the value of the clock output control signal 102 is 1.

Therefore, the output clock selecting circuit 200 outputs the input clock signal as the output clock signal. This is because that the phase of the output clock signal is closer to the phase of the ideal frequency-divided clock signal when outputting the input clock signal as it is as the output clock signal compared to a case when inverting and outputting the input clock signal.

Next, in cycle 1, the flip-flop circuit 121 stores the result of the comparator 112 in cycle 0, that is, the result that the phase calculation value 103 is less than N.

The selector circuit 114 refers to the result of the comparator 112 in the previous cycle stored by the flip-flop circuit 121. The selector circuit 114 selects the input −N in the case where the phase calculation value 103 is equal to or more than N, and it selects the input M−N in the case where the phase calculation value 103 is less than N.

In cycle 1, therefore, the selector circuit 114 selects the input M−N=8−5=3. The flip-flop circuit 120 stores the value 0 of the phase calculation value 103 in cycle 0. Consequently, the value of the phase calculation value 103 becomes the output of the adder 110, 0+3=3.

The comparator 113 refers to the comparison result of the value 6, which is double of the phase calculation value 103, and N (=5). Since the double value of the phase calculation value 103 is more than N, the comparator 113 outputs the value 1 to the clock phase control signal 101. The comparator 112 refers to the comparison result of the phase calculation value 103 and N. Since the value 3 of the phase calculation value 103 is less than N (=5), the comparator 112 outputs the value 1 to the clock output control signal 102.

Therefore, the output clock selecting circuit 200 inverts the input clock signal and outputs it to the output clock signal. This is because that the phase of the output clock signal is closer to the phase of the ideal frequency-divided clock signal when inverting and outputting the input clock signal compared to a case when outputting the input clock signal as it is as the output clock signal.

Next, in cycle 2, the flip-flop circuit 121 stores the result that the phase calculation value 103 is less than N in cycle 1.

Therefore, the selector circuit 114 selects the input M−N=3 and outputs it. The flip-flop circuit 120 stores the value 3 of the phase calculation value 103 in cycle 1. Consequently, the value of the phase calculation value 103 becomes the output of the adder 110, 3+3=6.

The comparator 113 refers to the comparison result of the value 12 which is double of the phase calculation value 103 and N (=5). Since the double value of the phase calculation value 103 is more than N, the comparator 113 outputs the value 1 as the clock phase control signal 101. The comparator 112 refers to the comparison result of the phase calculation value 103 and N. Since the value 6 of the phase calculation value 103 is more than N (=5), the comparator 112 outputs the value 0 as the clock output control signal 102. Therefore, the output clock selecting circuit 200 does not output the input clock signal as the output clock signal.

Next, in cycle 3, the flip-flop circuit 121 stores the result that the value of the phase calculation value 103 is equal to or more than N in cycle 2.

Therefore, the selector circuit 114 selects the input −N=−5 and outputs it. The flip-flop circuit 120 stores the value 6 of the phase calculation value 103 in cycle 2. Consequently, the value of the phase calculation value 103 becomes the output of the adder 110, 6−5=1.

The comparator 113 refers to the comparison result of the value 2 which is double of the phase calculation value 103 and N (=5). Since the double value of the phase calculation value 103 is less than N, the comparator 113 outputs the value 0 as the clock phase control signal 101. The comparator 112 refers to the comparison result of the phase calculation value 103 and N. Since the value 3 of the phase calculation value 103 is less than N (=5), the comparator 112 outputs the value 1 as the clock output control signal 102.

Therefore, the output clock selecting circuit 200 outputs the input clock signal as the output clock signal. This is because that the phase of the output clock signal is closer to the phase of the ideal frequency-divided clock signal when outputting the input clock signal as it is as the output clock signal compared to the case when inverting and outputting the input clock signal.

Similarly, in cycle 4, the value of the phase calculation value 103 is 1+3=4, the value of the clock phase control signal 101 is 1, and the value of the clock output control signal 102 is 1. Therefore, the output clock selecting circuit 200 inverts the input clock signal and outputs it as the output clock signal. This is because that the phase of the output clock signal is closer to the phase of the ideal frequency-divided clock signal when inverting and outputting the input clock signal compared to the case when outputting the input clock signal as it is as the output clock signal.

Similarly, in cycle 5, the value of the phase calculation value 103 is 4+3=7, the value of the clock phase control signal 101 is 1, and the value of the clock output control signal 102 is 0. Therefore, the output clock selecting circuit 200 does not output the input clock signal as the output clock signal.

Similarly, in cycle 6, the value of the phase calculation value 103 becomes 7−5=2, the value of the clock phase control signal 101 becomes 0, and the value of the clock output control signal 102 becomes 1. Therefore, the output clock selecting circuit 200 outputs the input clock signal as the output clock signal. This is because that the phase of the output clock signal is closer to the phase of the ideal frequency-divided clock signal when outputting the input clock signal as it is as the output clock signal compared to the case when inverting and outputting the input clock signal.

Similarly, in cycle 7, the value of the phase calculation value 103 becomes 2+3=5, the value of the clock phase control signal 101 becomes 1, and the value of the clock output control signal 102 becomes 0. Therefore, the output clock selecting circuit 200 does not output the input clock signal as the output clock signal.

In the cycle 0 which is next to cycle 7, the flip-flop circuit 121 stores the result that the phase calculation value 103 is equal to or more than N in cycle 7.

Therefore, the selector circuit 114 selects the input, −N=−5 and outputs it. The flip-flop circuit 120 stores the value 5 of the phase calculation value 103 in cycle 7. Consequently, the value of the phase calculation value 103 becomes the output of the adder 111, 5−5=0.

The comparator 113 refers to the comparison result of the value which is double of the phase calculation value 103 and N. Since the double value of the phase calculation value 103 is less than N, the value of the clock phase control signal 101 is 0. The comparator 112 refers to the comparison result of the phase calculation value 103 and N. Since the value of the phase calculation value 103 is less than N, the value of the clock output control signal 102 is 1.

Therefore, the output clock selecting circuit 200 outputs the input clock signal as the output clock signal. This situation is the same as that in cycle 0 described above. Consequently, after that, the operations from cycle 0 to cycle 7 are repeated.

As described above, in the exemplary embodiment 1, the input clock signal is inverted and output as the output clock signal in cycle 1 and cycle 4.

Therefore, the cycle time from the rising of the output clock signal in cycle 0 to the rising of the output clock signal in cycle 1 is extended to be 1.5 cycle of the input clock signal, for example. Similarly, the cycle time from the rising of the output clock signal in cycle 3 to the rising of the output clock signal in cycle 4 is extended to be 1.5 cycle of the input clock signal.

As described above, according to the rational frequency dividing circuit of the exemplary embodiment 1, the minimum cycle time of the frequency-divided clock signal can be extended to be 1.5 cycle of the input clock signal in accordance with the frequency dividing ratio. Further, the maximum cycle time of the frequency-divided clock signal is 2 cycle of the input clock signal, which is from the rising of the output clock signal in cycle 6 to the rising of the output clock signal in cycle 0, for example.

According to the rational frequency dividing circuit of the exemplary embodiment 1, the fluctuations in the minimum cycle time of the frequency-divided clock signal are ranged within 1.5 cycle to 2 cycle of the input clock signal. The fluctuations in the cycle time at every cycle are small.

The clock signal frequency dividing circuit according to the exemplary embodiment 1 controls the output clock selecting circuit 200 so as to select one of three situations: the input clock signal is output as it is, the input clock signal is inverted and output, and the input clock signal is not output and then generates the frequency-divided clock signal. Since the aforementioned control of the selection operates so as to select the one in which the phase of the output signal approximates the phase of the ideal frequency-divided clock signal having a constant cycle time, the minimum cycle time of the frequency-divided clock signal is extended in accordance with the frequency dividing ratio in many occasions. Therefore, it is possible to generate the rational frequency-divided clock signal having small fluctuations in the cycle time.

The output clock selecting circuit 200 according to the exemplary embodiment 1 is configured by only a digital logic circuit, and is enough to provide a function of selecting any one of three situations: the input clock signal is output as it is, the input clock signal is inverted and output, and the input clock signal is not output. So, its electric power consumption is low and its layout area is small. Further, since the output clock selecting circuit 200 does not use an analog circuit or a circuit which needs a dedicated design, its design and validation cost is low.

In the exemplary embodiment 1, the clock selection control circuit 100 inputs and uses the setting signals of the frequency dividing ratio, M−N, −N and N, which is not limited thereto. For example, by inputting M and N, M−N and −N may be generated in the circuit to be used.

Exemplary Embodiment 2

As for two integers N and M which define the frequency dividing ratio N/M, in the case where the denominator M of the frequency dividing ratio is limited to a power of 2, it is possible to reduce further amount of hardware needed to achieve a clock signal frequency dividing circuit according to this exemplary embodiment.

In the exemplary embodiment 2, the method of achieving the clock signal frequency dividing circuit in which needed amount of hardware is reduced by limiting the denominator M of the frequency dividing ratio to the power of 2 will be explained.

Here, the value of the power of 2 is a number obtained by raising 2 several times, which is represented by $2^k$ (k is an integer) such as $2^3$=2×2×2=8, $2^4$=2×2×2×2=16 or $2^5$=2×2×2×2×2=32, for example.

As shown in FIG. 4, the frequency dividing circuit according to the exemplary embodiment 2 includes a clock selection control circuit 150 and the output clock selecting circuit 200. Since the output clock selecting circuit 200 has the same structure as that in the aforementioned exemplary embodiment 1, it is given the same symbol and its details will be omitted.

The clock selection control circuit 150 operates at the timing of the input clock signal, inputs 2M−N which is the setting signal of the frequency dividing ratio and generates the clock phase control signal 101 and the clock output control signal 102 which are the control signals of the output clock selecting circuit 200 in each cycle of the input clock signal.

More specifically, the clock selection control circuit 150 includes adders 160 and 161, a flip-flop circuit 162 and a NAND element 163.

The flip-flop circuit 162 operates based on the timing of rising edge of the input clock signal (the input clock signal is not shown in FIG. 4).

When the denominator M of the frequency dividing ratio is represented by the value of the power of 2, $M=2^k$, the adders 160 and 161 are adders of k+1 bits wide. That is, in the case where the addition result becomes equal to or more than $2^{(k+1)}$, the value 1 is output to carry output.

The clock selection control circuit 150 is configured by standardizing the phase calculation circuit 105, the clock output judging circuit 106 and the clock phase judging circuit 107 in the clock selection control circuit 100 of the exemplary embodiment 1. This is made possible by limiting the denominator M of the frequency dividing ratio to the value of the power of 2. Therefore, amount of hardware needed for achieving the clock selection control circuit 150 is reduced.

Next, the operation of the clock selection control circuit 150 will be explained with reference to FIG. 5. FIG. 5 is a timing diagram showing the operation of the clock selection control circuit 150 when the frequency dividing ratio is N/M=5/8. The input clock signal, the output clock signal, a phase calculation value (a) 155 being the result output of the adder 160, a phase calculation carry value (a) 153 being the carry output of the adder 160, a phase calculation value (b) 156 being the result output of the adder 161, a phase calculation carry value (b) 154 being the carry output of the adder 161, the clock phase control signal 101 obtained by outputting the value of the phase calculation carry value (a) 153, and the clock output control signal 102 output by the NAND element 163 are shown.

Here, since the denominator M of the frequency dividing ratio is $M=8=2^3=2^k$, that is, k=3, the adders 160 and 161 are adders of k+1=3+1=4 bits wide. Therefore, in the case where the addition result is equal to or more than $2^{(k+1)}=2^4=16$, the value 1 is output as carry output.

In FIG. 5, the value stored by the flip-flop circuit 162 in cycle 0 is 0. The adder 160 adds the value 0 stored by the flip-flop circuit 162 and the value of setting signal of the input frequency dividing ratio, 2M−N=2×8−5=11, and outputs the value 11 as the phase calculation value (a) 155 and also outputs the value 0 as the phase calculation carry value (a) 153.

The adder 161 adds the value 11 of the phase calculation value (a) 155 and the value of setting signal of the input frequency dividing ratio, 2M−N=11. Since the addition result becomes 11+11=22, the adder 161 outputs the value 1 as the phase calculation carry value (b) 154. The adder 161 outputs the value 6 of low 4 bits as the phase calculation value (b) 156.

Therefore, the value of the clock phase control signal 101 is 0, and the value of the clock output control signal 102 is 1 in cycle 0. Consequently, the output clock selecting circuit 200 outputs the input clock signal as the output clock signal.

Next, in cycle 1, the flip-flop circuit 162 stores the value 6 of the phase calculation value (b) 156 in cycle 0.

The adder 160 adds the value 6 stored by the flip-flop circuit 162 and the value of setting signal of the input frequency dividing ratio, 2M−N=11. The addition result becomes 6+11=17, so the adder 160 outputs the value 1 as the phase calculation carry value (a) 153. The adder 160 outputs the value 1 of low 4 bits as the phase calculation value (a) 155. The adder 161 adds the value 1 of the phase calculation value (a) 155 and the value of setting signal of the input frequency dividing ratio, 2M−N=11, outputs the value 12 as the phase calculation value (b) 156 and also outputs the value 0 as the phase calculation carry value (b) 154 respectively.

Therefore, the value of the clock phase control signal 101 is 1, and the value of the clock output control signal 102 is 1 in cycle 1. Consequently, the output clock selecting circuit 200 inverts the input clock signal and outputs it as the output clock signal.

Next, in cycle 2, the flip-flop circuit 162 stores the value 12 of the phase calculation value (b) 156 in cycle 1.

The adder 160 adds the value 12 stored by the flip-flop circuit 162 and the value of setting signal of the input frequency dividing ratio, 2M−N=11, outputs the value 7 as the phase calculation value (a) 155 and also outputs the value 1 as the phase calculation carry value (a) 153 respectively. The adder 161 adds the value 7 of the phase calculation value (a) 155 and the value of setting signal of the input frequency dividing ratio, 2M−N=11, outputs the value 2 as the phase calculation value (b) 156 and also outputs the value 1 as the phase calculation carry value (b) 154 respectively.

Therefore, the value of the clock phase control signal 101 is 1, and the value of the clock output control signal 102 is 0 in cycle 2. Consequently, the output clock selecting circuit 200 does not output the input clock signal as the output clock signal.

Next, in cycle 3, the flip-flop circuit 162 stores the value 2 of the phase calculation value (b) 156 in cycle 2.

The adder 160 adds the value 2 stored by the flip-flop circuit 162 and the value of setting signal of the input frequency dividing ratio, 2M−N=11, outputs the value 13 as the phase calculation value (a) 155 and also outputs the value 0 as the phase calculation carry value (a) 153 respectively. The adder 161 adds the value 13 of the phase calculation value (a) 155 and the value of setting signal of the input frequency dividing ratio, 2M−N=11, outputs the value 8 as the phase calculation value (b) 156 and also outputs the value 1 as the phase calculation carry value (b) 154.

Therefore, the value of the clock phase control signal 101 is 0, and the value of the clock output control signal 102 is 1 in cycle 3. Consequently, the output clock selecting circuit 200 outputs the input clock signal as the output clock signal.

Similarly, in cycle 4, the phase calculation value (a) 155 is 3, the phase calculation carry value (a) 153 is 1, the phase calculation value (b) 156 is 14, and the phase calculation carry value (b) 154 is 0. Therefore, the value of the clock phase control signal 101 is 1, and the value of the clock output control signal 102 is 1 in cycle 4. The output clock selecting circuit 200 inverts the input clock signal and outputs it as the output clock signal.

Similarly, in cycle 5, the phase calculation value (a) 155 is 9, the phase calculation carry value (a) 153 is 1, the phase calculation value (b) 156 is 4, and the phase calculation carry value (b) 154 is 1. Therefore, the value of the clock phase control signal 101 is 1, and the value of the clock output control signal 102 is 0 in cycle 5. The output clock selecting circuit 200 does not output the input clock signal as the output clock signal.

Similarly, in cycle 6, the phase calculation value (a) 155 is 15, the phase calculation carry value (a) 153 is 0, the phase calculation value (b) 156 is 10, and the phase calculation carry value (b) 154 is 1. Therefore, the value of the clock phase control signal 101 is 0, and the value of the clock output control signal 102 is 1 in cycle 6. The output clock selecting circuit 200 outputs the input clock signal as the output clock signal.

Similarly, in cycle 7, the phase calculation value (a) 155 is 5, the phase calculation carry value (a) 153 is 1, the phase calculation value (b) 156 is 0, and the phase calculation carry value (b) 154 is 1. Therefore, the value of the clock phase control signal 101 is 1, and the value of the clock output control signal 102 is 0 in cycle 7. The output clock selecting circuit 200 does not output the input clock signal as the output clock signal.

In the cycle 0 which is next to cycle 7, the flip-flop circuit 162 stores the value 0 of the phase calculation value (b) 156 in cycle 7. The adder 160 adds the value 0 stored by the flip-flop circuit 162 and the value of setting signal of the input frequency dividing ratio, 2M−N=11, outputs the value 11 as the phase calculation value (a) 155 and also outputs the value 0 as the phase calculation carry value (a) 153 respectively. The adder 161 adds the value 11 of the phase calculation value (a) 155 and the value of setting signal of the input frequency dividing ratio, 2M−N=11, outputs the value 6 as the phase calculation value (b) 156 and outputs the value 1 as the phase calculation carry value (b) 154 respectively.

Consequently, the value of the clock phase control signal 101 is 0, and the value of the clock output control signal 102 is 1. The output clock selecting circuit 200 outputs the input clock signal as the output clock signal. This situation is the same as that in cycle 0 described above. Therefore, after that, the operations from cycle 0 to cycle 7 are repeated.

As described above, the frequency-divided clock signal output by the frequency dividing circuit in the exemplary embodiment 2 is the same as the frequency-divided clock signal output by the frequency dividing circuit in the exemplary embodiment 1. The clock frequency dividing circuit according to the exemplary embodiment 2 also controls the output clock selecting circuit 200 so as to select one of three situations: the input clock signal is output as it is, the input clock signal is inverted and output, and the input clock signal is not output, and then generates the frequency-divided clock signal. Since the aforementioned control of the selection operates so as to select the one in which the phase of the output signal approximates the phase of the ideal frequency-divided clock signal having a constant cycle time, the minimum cycle time of the frequency-divided clock signal is extended in accordance with the frequency dividing ratio in many occasions. Consequently, it is possible to generate the rational frequency-divided clock signal having small fluctuations in the cycle time.

According to the exemplary embodiment 2, as for two integers N and M which define the frequency dividing ratio N/M, it is possible to reduce amount of hardware needed for achieving the clock selection control circuit to control the clock selecting circuit by limiting the denominator M of the frequency dividing ratio to the power of 2. Therefore, it is possible to achieve the rational clock signal frequency dividing circuit in which its electric power consumption is low and its layout area is small.

In the exemplary embodiment 2, the clock selection control circuit 150 inputs and uses the setting signal of the frequency dividing ratio, 2M−N, which is not limited thereto. For example, by inputting M and N, 2M−N may be generated in the circuit to be used.

Exemplary Embodiment 3

Next, another example of the clock selecting circuit will be explained as the exemplary embodiment 3 with reference to FIG. 6. FIG. 6 is a configuration diagram showing a clock selecting circuit 300 according to the exemplary embodiment 3.

As shown in FIG. 6, the clock selecting circuit 300 includes a selection control signal converting circuit 350, AND elements 310 and 311, an OR element 312, an inverter element 313 and flip-flop circuits 314 and 315.

The selection control signal converting circuit 350 includes AND elements 351 and 352, and an inverter 353. The selection control signal converting circuit 350 converts the clock phase control signal 101 and the clock output control signal 102 generated by the clock selection control circuit into a clock output control signal (p) 301 and a clock output control signal (n) 302 respectively so as to adapt to be used in the clock selecting circuit 300.

The flip-flop circuit 314 latches the clock output control signal (p) 301 at the falling timing of the input clock signal and outputs it as a clock output control signal (p) 303. The flip-flop circuit 315 latches the clock output control signal (p) 302 at the rising timing of the input clock signal and outputs it as a clock output control signal (p) 304.

The AND element 310 masks the input clock signal based on the clock output control signal (p) 303. More specifically, in the case where the value of the clock output control signal (p) 303 is 0, the AND element 310 masks the input clock signal. In the case where the value of the clock output control signal (p) 303 is 1, the AND element 310 does not mask the input clock signal.

The inverter element 313 inverts the input clock signal. The AND element 311 masks the signal obtained by inverting the input clock signal based on a clock output control signal (n) 304. The OR element 312 converges the input clock signal passing through the AND element 310 and the signal obtained by inverting the input clock signal passing through the AND element 311 and outputs it as the output clock signal.

Next, the operation of the clock selecting circuit 300 will be explained with reference to FIG. 7. FIG. 7 is a timing diagram showing the operation of the clock selecting circuit 300 when the frequency dividing ratio is N/M=5/8. The input clock signal, the output clock signal, the clock phase control signal 101 and the clock output control signal 102 output by the clock selection control circuit, the clock output control signal (p) 303 output by the flip-flop circuit 314, and the clock output control signal (n) 304 output by the flip-flop circuit 315 are shown.

The clock phase control signal 101 and the clock output control signal 102 are the same as control signals generated by the clock selection control circuit 100 according to the exemplary embodiment 1 or the clock selection control circuit 150 according to the exemplary embodiment 2, so the details will be omitted.

The selection control signal converting circuit 350 converts the clock phase control signal 101 and the clock output control signal 102 generated by the clock selection control circuit into the clock output control signal (p) 301 and the clock output control signal (n) 302 so as to select any one of three situations: the input clock signal is output as it is, the input clock signal is inverted and output, and the input clock signal is not output. That is, in the case of outputting the input clock signal, the selection control signal converting circuit 350 outputs the value 1 as the clock output control signal (p) 301 and also outputs the value 0 as the clock output control signal (n) 302 respectively in order to disable the mask function of the AND element 310 and to enable the mask function of the AND element 311. In the case of inverting and outputting the input clock signal, the selection control signal converting circuit 350 outputs the value 0 as the clock output control signal (p) 301 and also outputs the value 1 as the clock output control signal (n) 302 respectively in order to enable the mask function of the AND element 310 and to disable the mask function of the AND element 311. In the case of not outputting the input clock signal, the selection control signal converting circuit 350 outputs the value 0 as the clock output control signal (p) 301 and also outputs the value 0 as the clock output control signal (n) 302 respectively in order to enable the mask function of the AND element 310 and the mask function of the AND element 311.

The flip-flop circuit 314 has a function of limiting the transition of the clock output control signal (p) 303 to the timing at which the value of the input clock signal is 0, by latching the clock output control signal (p) 301 at the falling timing of the input clock signal and outputting it as the clock output control signal (p) 303. The flip-flop circuit 315 has a function of limiting the transition of the clock output control signal (n) 304 to the timing at which the value of the input clock signal is 1, by latching the clock output control signal (p) 302 at the rising timing of the input clock signal and outputting it as the clock output control signal (p) 304. Since glitch in the output clock signal is reduced by the aforementioned functions, the timing planning of the clock selecting circuit and the clock selection control circuit is easily performed.

In the exemplary embodiment 3, the AND element is used as an element for masking the input clock signal or the signal obtained by inverting the input clock signal based on the clock output control signal, and the OR element is used as an element for converging the signals passing through the AND element which has a function of masking the above two signals, which are not limited thereto. The OR element and the AND element may be used respectively, or any other circuits which have equivalent functions may be used.

Exemplary Embodiment 4

Next, another example of the clock selecting circuit will be explained as the exemplary embodiment 4 with reference to FIG. 8. As shown in FIG. 8, a clock selecting circuit 400 includes an AND element 410, a XOR element, an OR element 412, flip-flop circuit 413 and 414 and a selection control signal converting circuit 450.

The selection control signal converting circuit 450 includes AND elements 451 and 453 and an inverter 452 as shown in FIG. 8. The selection control signal converting circuit 450 converts the clock phase control signal 101 and the clock output control signal 102 generated by the clock selection control circuit into a clock output control signal 401 and a clock phase control signal 402 respectively so as to adapt to be used in the clock selecting circuit 400.

The flip-flop circuit 413 latches the clock phase control signal 402 at the rising timing of the input clock signal and outputs it as a clock phase control signal 404. The flip-flop circuit 414 latches the clock output control signal 401 at the falling timing of the input clock signal and outputs it as a clock output control signal 403.

The XOR element 411 controls either outputting the input clock signal or inverting and outputting the input clock signal based on the clock phase control signal 404. The OR element 412 outputs the OR result of the clock output control signal 403 and the clock phase control signal 404 as a clock output control signal 405. The AND element 410 masks the input clock signal or the signal obtained by inverting the input clock signal based on the clock output control signal 405.

Next, the operation of the clock selecting circuit 400 will be explained with reference to FIG. 9. FIG. 9 is a timing diagram showing the operation of the clock selecting circuit 400 when the frequency dividing ratio is N/M=5/8. The input clock signal, the output clock signal, the clock phase control signal 101 and the clock output control signal 102 which are output by the clock selection control circuit, the clock output control signal 403 output by the flip-flop circuit 414, the clock phase control signal 404 output by the flip-flop circuit 413, and the clock output control signal 405 output by the OR element 412 are shown in FIG. 9.

The clock phase control signal 101 and the clock output control signal 102 are the same as the control signals generated by the clock selection control circuit 100 in the exemplary embodiment 1 or the clock selection control circuit 150 in the exemplary embodiment 2, so the details will be omitted.

The selection control signal converting circuit 450 converts the clock phase control signal 101 and the clock output control signal 102 generated by the clock selection control circuit into the clock output control signal 401 and the clock phase control signal 402 so as to select any one of three situations: the input clock signal is output as it is, the input clock signal is inverted and output, and the input clock signal is not output. That is, in the case of outputting the input clock signal as it is, the selection control signal converting circuit 450 outputs the value 1 as the clock output control signal 401 and also outputs the value 0 as the clock phase control signal 402 respectively in order to disable the function of inverting the input clock signal by the XOR element 411 and to enable the mask function of the AND element 410. In the case of inverting and outputting the input clock signal, the selection control signal converting circuit 450 outputs the value 0 as the clock output control signal 401 and also outputs the value 1 as the clock phase control signal 402 respectively in order to enable the function of inverting the input clock signal by the XOR element 411 and to disable the mask function of the AND element 410. In the case of not outputting the input clock signal, the selection control signal converting circuit 450 outputs the value 0 as the clock output control signal 401 and also outputs the value 0 as the clock phase control signal 402 respectively in order to enable the mask function of the AND element 410.

The flip-flop circuit 413 limits the transition of the clock output control signal 405 to the timing at which the value of the signal obtained by inverting the input clock signal is 0, by latching the clock phase control signal 402 at the rising timing of the input clock signal and outputting it as the clock phase control signal 404. The flip-flop circuit 414 limits the transition of the clock output control signal 405 to the timing at which the value of the input clock signal is 0 by latching the clock output control signal 401 at the falling timing of the input clock signal and outputting it as the clock output control signal 403. Since the glitch in the output clock signal is reduced by the aforementioned function of the flip-flop circuits 413 and 414, the timing planning of the clock selecting circuit and the clock selection control circuit is easily performed.

According to the exemplary embodiment 4, a timing path in which the clock signal passes through from the input clock signal to the output clock signal and which needs consideration about the timing of the circuit driven by the output clock signal in planning the timing is only a path passing through the XOR element 411 and the AND element 410. Therefore, it is effective in planning the timing of the circuit driven by the output clock signal easily.

In the exemplary embodiment 4, the XOR element is used as an element for controlling either outputting the input clock signal as it is or inverting and outputting the input clock signal based on the clock phase control signal 404, and the AND element is used as an element for masking the input clock signal or the signal obtained by inverting the input clock signal based on the clock output control signal 405, which are not limited thereto. A XNOR element or an OR element may be used respectively, or any other circuits having equivalent functions may be used.

In the embodiments of the present invention, it is preferable that the aforementioned control unit includes: a unit for calculating the phase of the ideal frequency-divided clock signal in which the frequency dividing ratio is N/M and the cycle time is constant with respect to the input clock signal; a unit for judging whether or not to output the input clock signal as the output clock signal with reference to the result calculated by the unit for calculating the phase; and a unit for judging the phase being closer to the phase of the ideal frequency-divided clock signal, out of the phase of the output clock signal in the case of outputting the input clock signal as it is and the phase of the output clock signal in the case of inverting and outputting the input clock signal, with reference to the result calculated by the unit for calculating the phase.

Further, in the embodiments of the present invention, the control unit may also include: a storing unit; a first adder to add the value stored by the storing unit and the value obtained by subtracting the integer N from double of the integer M defining the frequency dividing ratio; and a second adder to add the output by the first adder and the value obtained by subtracting the integer N from double of the integer M defining the frequency dividing ratio, wherein the storing unit may store the addition result of the second adder at every cycle of the input clock signal and generate a control signal for controlling the clock selecting circuit from the carry signal of the first and second adders.

Further, in the embodiments of the present invention, it is preferable that the clock selecting circuit includes: a unit for masking the value of the input clock signal to the value 0 or the value 1; a unit for inverting the value of the input clock signal; and a unit for selecting either the signal that the value of the input clock signal is not inverted or the signal that the value of the input clock signal is inverted.

Further, in the embodiments of the present invention, the clock selecting circuit may also include: a unit for masking the value of the input clock signal to the value 0 or the value 1; a unit for masking the value of the signal obtained by inverting the value of the input clock signal to the value 0 or the value 1; and a unit for converging the output of the unit for masking the value of the input clock signal and the output of the unit for masking the value of the signal obtained by inverting the value of the input clock signal so as to output it.

Furthermore, in the embodiments of the present invention, the clock selecting circuit may also include: a unit for generating either the value of the input clock signal or the value of the signal obtained by inverting the value of the input clock signal based on the value of the input control signal; and a unit for masking the output of the unit for outputting either the value of the input clock signal or the value of the signal obtained by inverting the value of the input clock signal to the value 0 or the value 1.

As described above, the present invention has been explained with reference to the embodiments (and the examples). However, the present invention is not limited to the above embodiments (and the examples). As for the configuration and details of the present invention, various modifications that one skilled in the art can understand can be performed within the scope of the present invention.

This application claims priority from Japanese Patent Application No. 2006-322410 filed Nov. 29, 2006, which is incorporated herein in its entirety.

INDUSTRIAL APPLICABILITY

According to the present invention, it is possible to provide a clock signal frequency dividing circuit and a clock signal frequency dividing method in which the fluctuations in the cycle time of a frequency-divided clock signal are small, there are many occasions in which the minimum cycle time of the frequency-divided clock signal is extended in accordance with a frequency dividing ratio, its electric power consumption is low and its layout area is small, and also a design and validation cost is low.

BRIEF DESCRIPTION OF THE DRAWINGS

FIG. 10 is a timing diagram showing the operation example of rational clock frequency division by the related arts.

DESCRIPTION OF SYMBOLS

Figure 1:
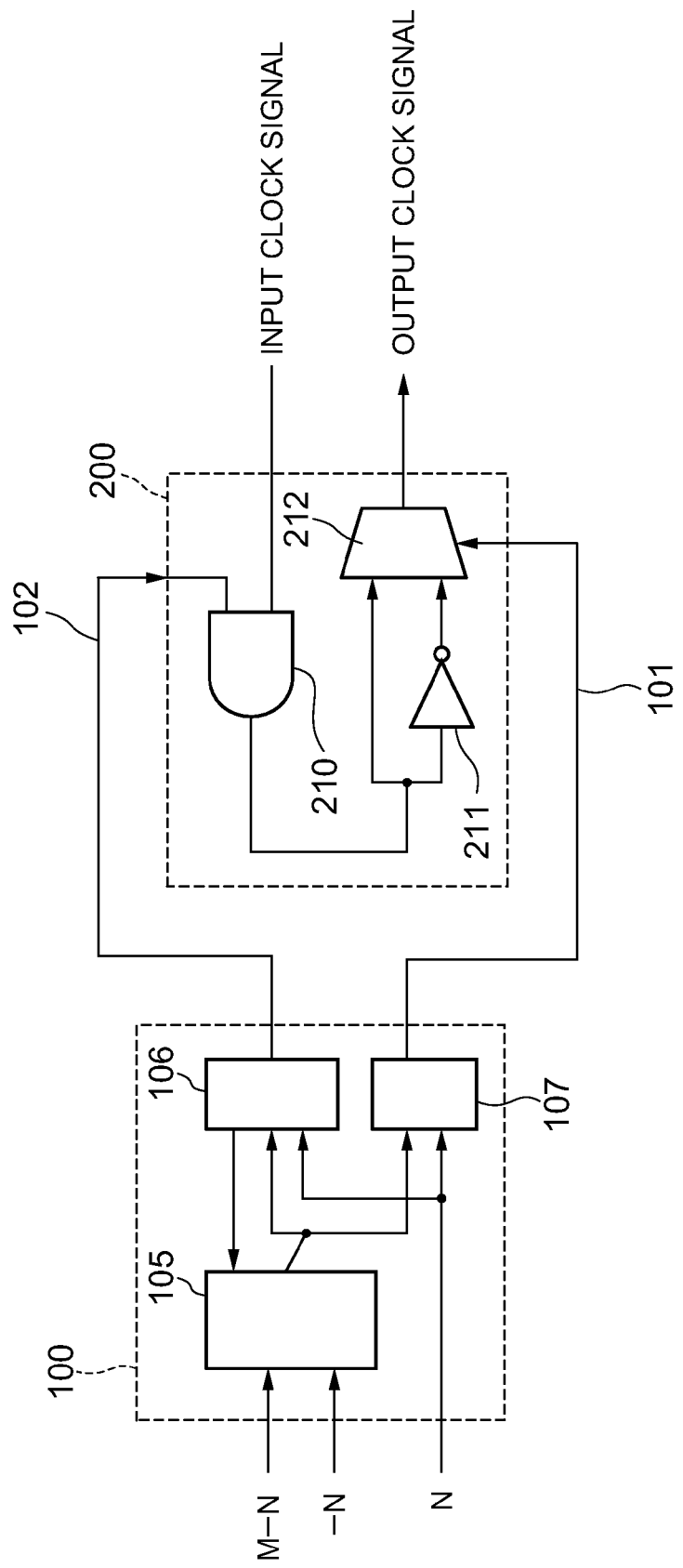
FIG. 1 is a configuration diagram showing a clock frequency dividing circuit according to an exemplary embodiment 1 of the present invention.
Figure 2:
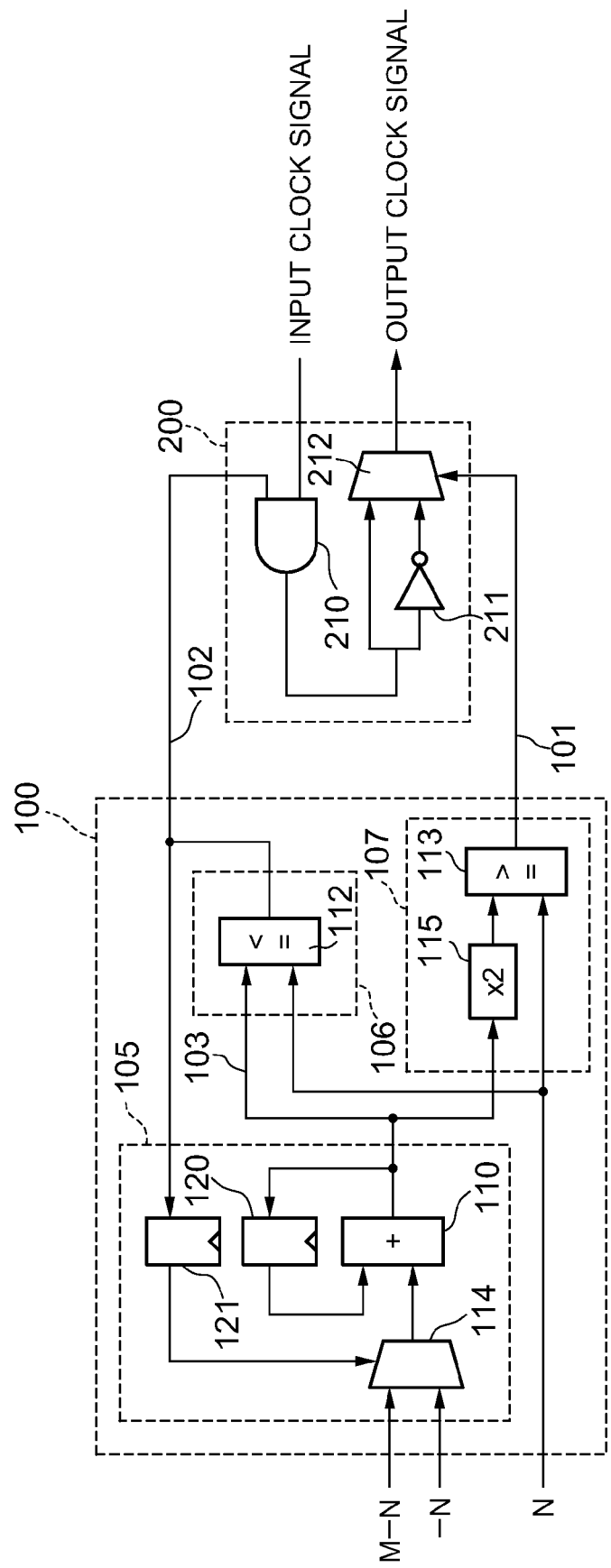
FIG. 2 is a configuration diagram showing a clock selection control circuit in the exemplary embodiment 1 of the present invention.
Figure 3:
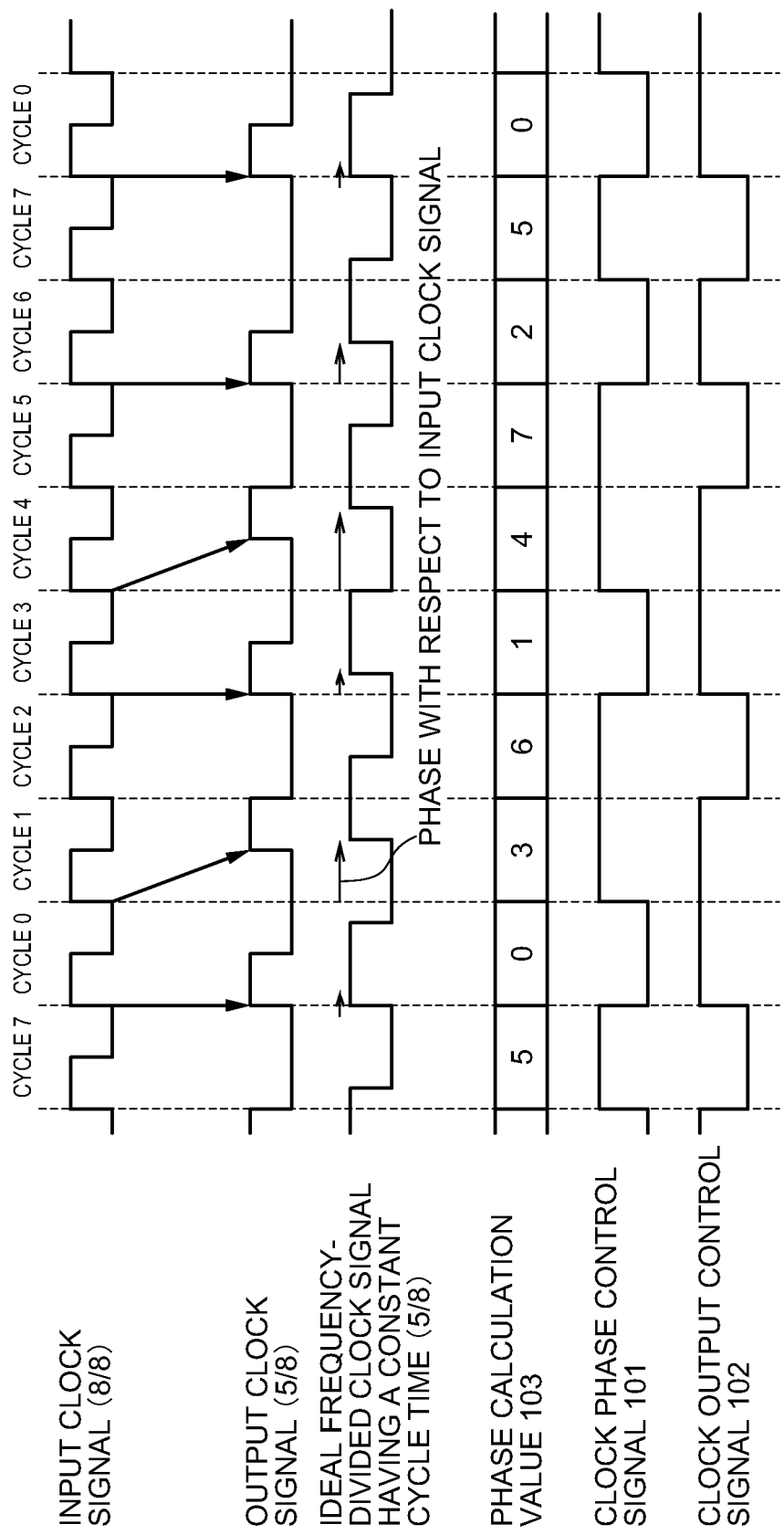
FIG. 3 is a timing diagram showing the operation of the clock frequency dividing circuit in the exemplary embodiment 1 of the present invention.
Figure 4:
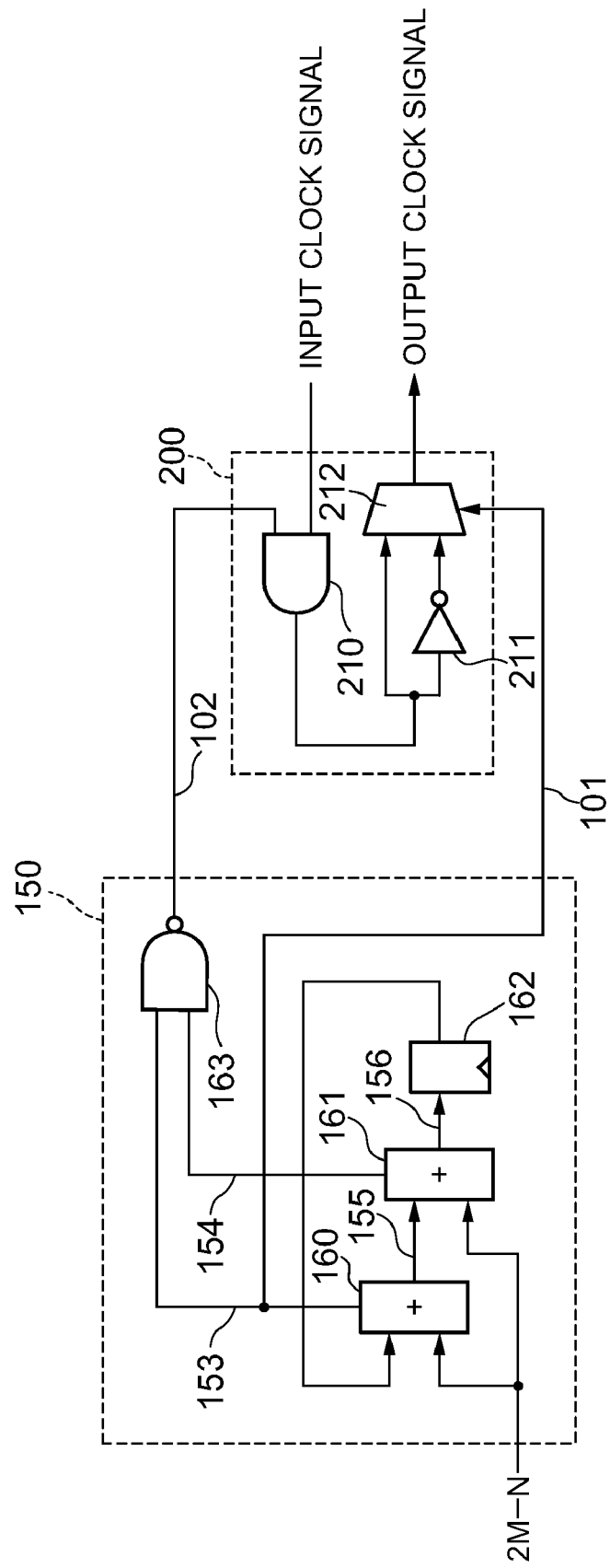
FIG. 4 is a configuration diagram showing a clock frequency dividing circuit according to an exemplary embodiment 2 of the present invention.
Figure 5:
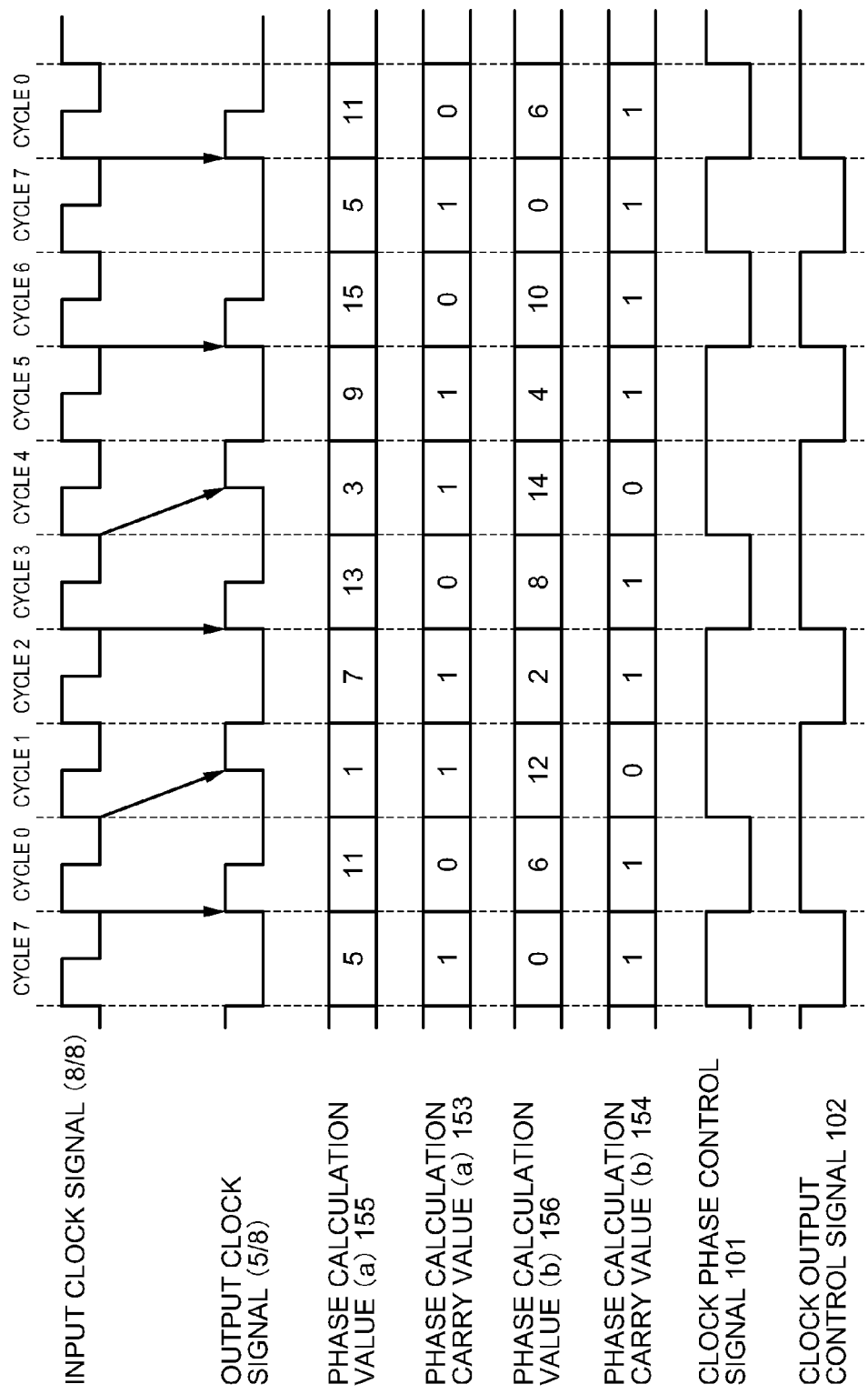
FIG. 5 is a timing diagram showing the operation of the clock frequency dividing circuit in the exemplary embodiment 2 of the present invention.
Figure 6:
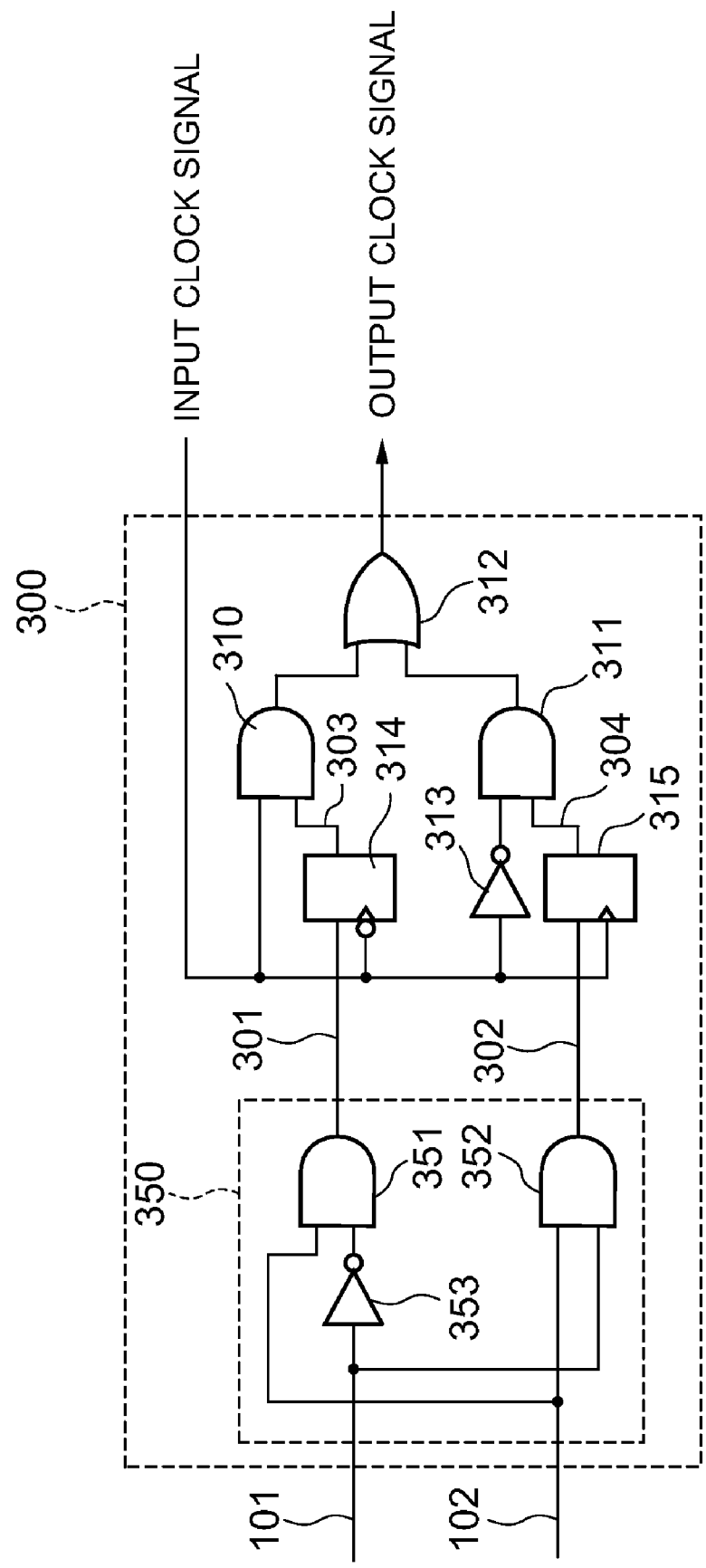
FIG. 6 is a configuration diagram showing a clock frequency dividing circuit in an exemplary embodiment 3 of the present invention.
Figure 7:
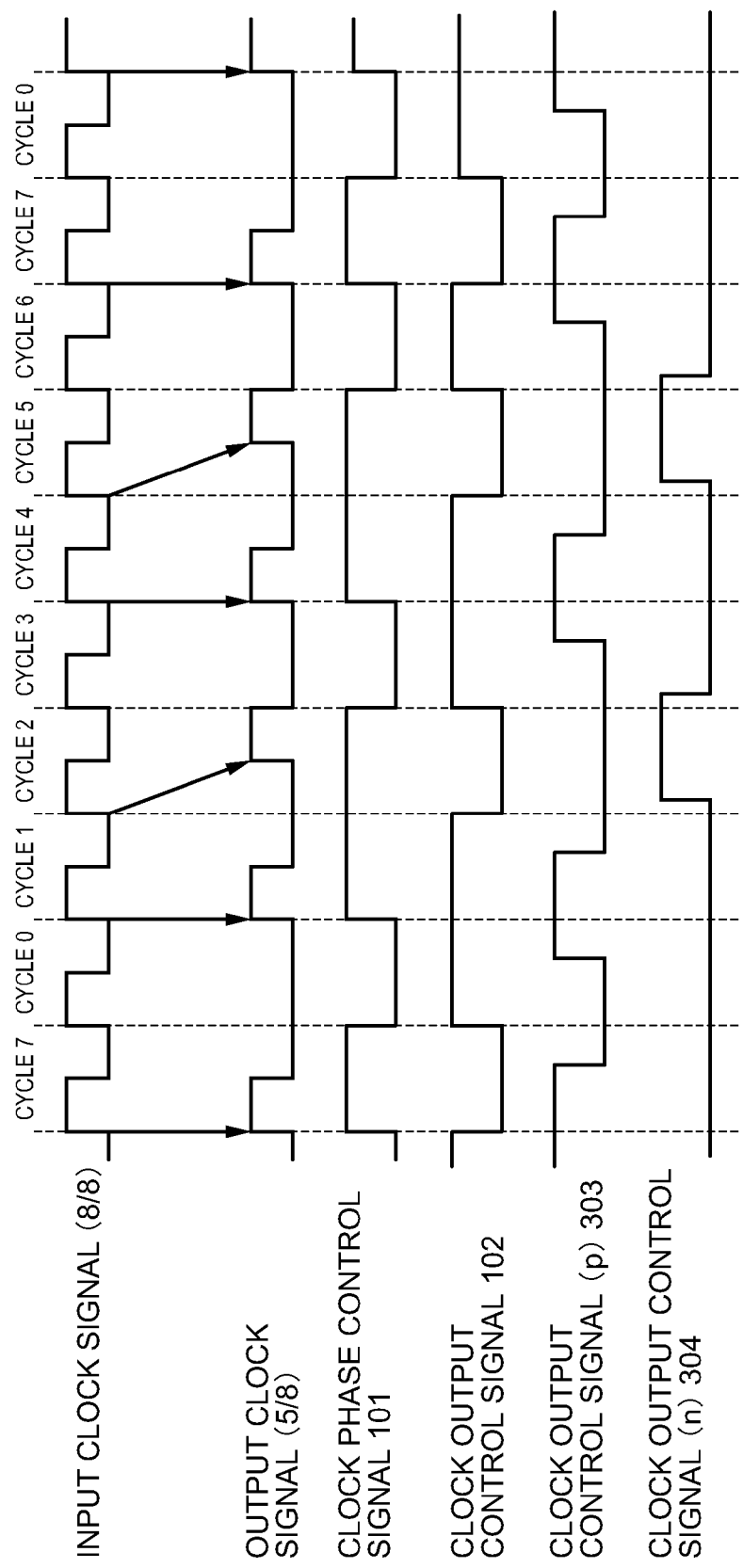
FIG. 7 is a timing diagram showing the operation of the clock frequency dividing circuit in the exemplary embodiment 3 of the present invention.
Figure 8:
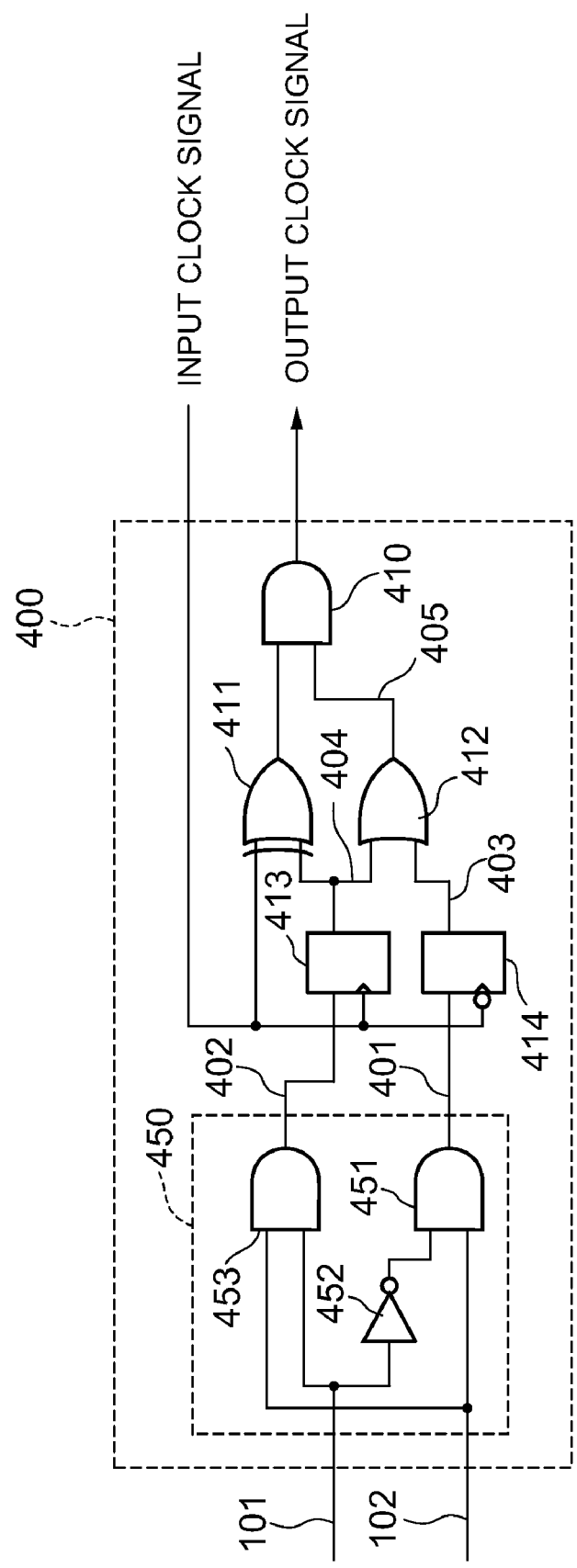
FIG. 8 is a configuration diagram showing a clock frequency dividing circuit in an exemplary embodiment 4 of the present invention.
Figure 9:
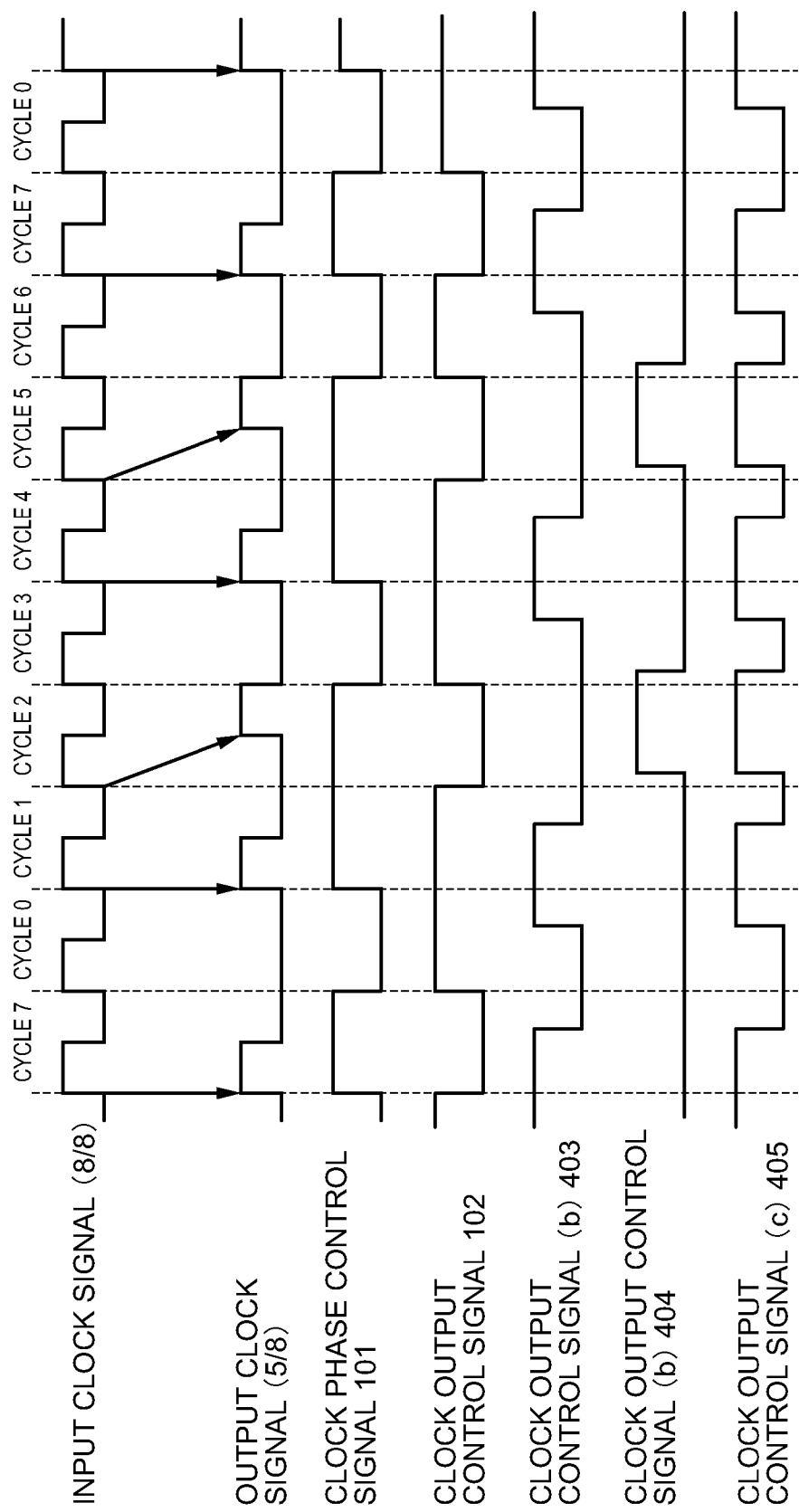
FIG. 9 is a timing diagram showing the operation of the clock frequency dividing circuit in the exemplary embodiment 4 of the present invention.

100 clock selection control circuit
110 adder
112, 113 comparator
114 selector circuit
115 double multiplier
120, 121 flip-flop circuit
150 clock selection control circuit
160, 161 adder
162 flip-flop circuit
163 NAND element
200 output clock selecting circuit
210 AND circuit
211 inverter circuit
212 selector circuit
300 clock selecting circuit
310, 311 AND element
312 OR element
313 inverter element
314, 315 flip-flop circuit
350 selection control signal converting circuit
400 clock selecting circuit 410 AND element
411 XOR element
412 OR element
413, 414 flip-flop circuit
450 selection control signal converting circuit

What is claimed is:

1. A clock signal frequency dividing circuit in which a frequency dividing ratio is defined as N/M being a ratio of two integers N and M, comprising:
   a clock selecting circuit for selecting only one of three situations: an input clock signal is output as has been inputted, the input clock signal is inverted and output, and the input clock signal is not output; and
   a control unit for generating a control signal to control the selection by the clock selecting circuit; wherein
   the control unit controls the selection by the clock selecting circuit at every cycle of the input clock signal, wherein the control unit includes:
   a unit for calculating the phase of an ideal frequency-divided clock signal in which the frequency dividing ratio is N/M and the cycle time is constant with respect to the input clock signal;
   a unit for judging whether to output the input clock signal as an output clock signal with reference to the calculation result by the unit for calculating the phase; and
   a unit for judging the phase being closer to the phase of the ideal frequency-divided clock signal, out of the phase of the output clock signal in the case of outputting the input clock signal and the phase of the output clock signal in the case of inverting and outputting the input clock signal, with reference to the calculation result by the unit for calculating the phase.

2. A clock signal frequency dividing circuit in which a frequency dividing ratio is defined as N/M being a ratio of two integers N and M, comprising:
   a clock selecting circuit for selecting only one of three situations: an input clock signal is output as has been inputted, the input clock signal is inverted and output, and the input clock signal is not output; and
   a control unit for generating a control signal to control the selection by the clock selecting circuit; wherein
   the control unit controls the selection by the clock selecting circuit at every cycle of the input clock signal, wherein the clock selecting circuit includes:
   a unit for masking the value of the input clock signal to the value 0 or the value 1;
   a unit for inverting the value of the input clock signal; and
   a unit for selecting either the signal obtained by not inverting the value of the input clock signal or the signal obtained by inverting the value of the input clock signal.

3. A clock signal frequency dividing circuit in which a frequency dividing ratio is defined as N/M being a ratio of two integers N and M, comprising:
   a clock selecting circuit for selecting only one of three situations: an input clock signal is output as has been inputted, the input clock signal is inverted and output, and the input clock signal is not output; and
   a control unit for generating a control signal to control the selection by the clock selecting circuit; wherein
   the control unit controls the selection by the clock selecting circuit at every cycle of the input clock signal, wherein selecting from the three situations provides for generation of a rational frequency-divided signal having fluctuations in cycle time less than a predetermined threshold, such that a minimum cycle time is extended.

4. A clock signal frequency dividing method for outputting a clock signal in which a frequency dividing ratio is defined as N/M being a ratio of two integers N and M, comprising:
   selecting step of selecting only one of three situations: an input clock signal is output as has been inputted, the input clock signal is inverted and output, and the input clock signal is not output; and
   controlling step of generating a control signal to control the selection in the selecting step, wherein
   in the controlling step, the selection of the selecting step is controlled at every cycle of the input clock signal, wherein selecting from the three situations provides for generation of a rational frequency-divided signal having fluctuations in cycle time less than a predetermined threshold, such that a minimum cycle time is extended.

5. A clock signal frequency dividing circuit in which a frequency dividing ratio is defined as N/M being a ratio of two integers N and M, comprising:
   clock selecting means for selecting only one of three situations: an input clock signal is output as has been inputted, the input clock signal is inverted and output, and the input clock signal is not output; and
   control means for generating a control signal to control the selection by the clock selecting means; wherein
   the control means controls the selection by the clock selecting means at every cycle of the input clock signal, wherein selecting from the three situations provides for generation of a rational frequency-divided signal having fluctuations in cycle time less than a predetermined threshold, such that a minimum cycle time is extended.

* * * * *